(12) United States Patent
Lee (10) Patent No.: US 11,557,662 B2
(45) Date of Patent: Jan. 17, 2023

(54) JUNCTION FIELD EFFECT TRANSISTOR ON SILICON-ON-INSULATOR SUBSTRATE

(71) Applicant: Texas Instruments Incorporated, Dallas, TX (US)

(72) Inventor: Zachary Ka Fai Lee, Fremont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/087,326

(22) Filed: Nov. 2, 2020

(65) Prior Publication Data

US 2022/0140116 A1   May 5, 2022

(51) Int. Cl.
*H01L 29/66* (2006.01)
*H01L 29/808* (2006.01)
*H01L 29/10* (2006.01)

(52) U.S. Cl.
CPC .... *H01L 29/66893* (2013.01); *H01L 29/1058* (2013.01); *H01L 29/1066* (2013.01); *H01L 29/808* (2013.01)

(58) Field of Classification Search
CPC ............. H01L 29/66893; H01L 29/808; H01L 29/1066; H01L 29/1058; H01L 2924/13062; H01L 29/8086
See application file for complete search history.

(56) References Cited

U.S. PATENT DOCUMENTS

| | | | |
|---|---|---|---|
| 5,973,341 A | 10/1999 | Letavic et al. | |
| 7,417,270 B2 | 8/2008 | Hower et al. | |
| 10,446,695 B2 | 10/2019 | Bhalla et al. | |
| 2005/0173726 A1* | 8/2005 | Potts | H01L 29/8083 257/E29.313 |
| 2009/0101941 A1 | 4/2009 | Ellis-Monaghan et al. | |
| 2010/0032712 A1 | 2/2010 | Udrea et al. | |
| 2010/0032731 A1* | 2/2010 | Babcock | H01L 29/812 257/280 |
| 2014/0231883 A1* | 8/2014 | Esteve | H01L 29/8083 438/192 |
| 2015/0054038 A1 | 2/2015 | Masliah et al. | |
| 2015/0118817 A1* | 4/2015 | Imai | H01L 21/823418 438/308 |
| 2015/0179452 A1* | 6/2015 | Hower | H01L 29/36 257/272 |
| 2016/0133701 A1* | 5/2016 | O hAnnaidh | H01L 29/4238 257/401 |

(Continued)

OTHER PUBLICATIONS

International Search Report, 2 pages, dated Jan. 20, 2022.

*Primary Examiner* — Wasiul Haider
(74) *Attorney, Agent, or Firm* — Andrew R. Ralston; Charles A. Brill; Frank D. Cimino (57) ABSTRACT

A semiconductor device includes a junction field effect transistor (JFET) on a silicon-on-insulator (SOI) substrate. The JFET includes a gate with a first gate segment contacting the channel on a first lateral side of the channel, and a second gate segment contacting the channel on a second, opposite, lateral side of the channel. The first gate segment and the second gate segment extend deeper in the semiconductor layer than the channel. The JFET further includes a drift region contacting the channel, and may include a buried layer having the same conductivity type as the channel, extending at least partway under the drift region.

15 Claims, 9 Drawing Sheets

(56) References Cited

U.S. PATENT DOCUMENTS

2018/0166547 A1  6/2018 Chen et al.
2019/0081135 A1* 3/2019 Karino .................. H01L 29/808
2020/0373437 A1* 11/2020 Tanaka .................. H01L 27/098

* cited by examiner

JUNCTION FIELD EFFECT TRANSISTOR ON SILICON-ON-INSULATOR SUBSTRATE

FIELD

This disclosure relates to the field of semiconductor devices. More particularly, but not exclusively, this disclosure relates to junction field effect transistors in semiconductor devices.

BACKGROUND

A junction field effect transistor (JFET) commonly has a top gate and a bottom gate to control (pinch) the JFET channel, which is sandwiched between the top and bottom gates. The top and bottom gates commonly include diffusion regions over and under the channel. In devices made on silicon-on-insulator (SOI) substrates, the device silicon layer may be less than 10 microns thick, making it difficult to form separate top and bottom diffusion regions as well as the channel which lies between the two.

SUMMARY

The present disclosure introduces a semiconductor device including a junction field effect transistor (JFET) on a silicon-on-insulator (SOI) substrate that includes a semiconductor layer on a dielectric layer. The JFET includes a gate having a first conductivity type in the semiconductor layer, and a channel having second, opposite, conductivity type in the semiconductor layer. The gate includes a first gate segment contacting the channel on a first lateral side of the channel, and a second gate segment contacting the channel on a second, opposite, lateral side of the channel. The first gate segment and the second gate segment extend deeper in the semiconductor layer than the channel. The JFET further includes a drift region having the second conductivity type contacting the channel.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device is formed on a silicon-on-insulator (SOI) substrate. The SOI substrate includes a dielectric layer, and a semiconductor layer on the dielectric layer. The semiconductor layer has a bottom surface at a boundary between the semiconductor layer and the dielectric layer, and a top surface located opposite from the boundary between the semiconductor layer and the dielectric layer. The semiconductor device includes a junction field effect transistor (JFET) in and on the semiconductor layer.

The JFET includes a gate in the semiconductor layer and a channel in the semiconductor layer. The gate has a first conductivity type, and the channel has a second conductivity type, opposite from the first conductivity type. The gate includes a first gate segment extending to the top surface and contacting the channel on a first lateral side of the channel, and a second gate segment extending to the top surface and contacting the channel on a second lateral side of the channel, located opposite from the first side. The first gate segment and the second gate segment extend deeper in the semiconductor layer from the top surface than the channel. The term "lateral side" refers to a side that is perpendicular to a plane of the bottom surface of the semiconductor layer.

The JFET includes a source in the semiconductor layer, the source having the second conductivity type. The source contacts the channel. The JFET includes a drift region in the semiconductor layer, the drift region having the second conductivity type. The drift contacts the channel, on an opposite side of the channel from the source. The JFET includes a drain in the semiconductor layer, the drain having the second conductivity type. The drain contacts the drift region, on an opposite side of the drift region from the channel.

The JFET may include a drain-side buried layer in the semiconductor layer, the drain-side buried layer having the second conductivity type. The drain-side buried layer may have an average net concentration of second conductivity type dopants higher than the drift region, or lower than the drift region. The drain-side buried layer is located between the bottom surface and the drift region, and extends laterally from the drain at least partway under the drift region.

The term "first conductivity type dopants" and the term "second conductivity type dopants" refer to dopants which provide the first conductivity type and dopants which provide the second conductivity type, respectively, in a semiconductor material. For example, for a case in which the first conductivity type is p-type and the second conductivity type is n-type, boron, gallium, and indium are first conductivity type dopants, as they provide p-type conductivity in the semiconductor material, and phosphorus, arsenic, and antimony are second conductivity type dopants, as they provide n-type conductivity in the semiconductor material. The term "average net concentration of second conductivity type dopants" refers to an average concentration of second conductivity type dopants minus an average concentration of first conductivity type dopants. The average net concentration of second conductivity type dopants in a semiconductor region is related to an electrical conductivity in the semiconductor region. Similarly, the term "average net concentration of first conductivity type dopants" refers to an average concentration of first conductivity type dopants minus an average concentration of second conductivity type dopants.

When two semiconductor regions are disclosed as having equal average net concentrations of first (or second) conductivity type dopants, the average net concentrations are understood to be equal within tolerances normally encountered in fabrication process, such as ion implantation, used to form the two semiconductor regions; thus the average net concentrations may be equal within 3 percent.

It is noted that terms such as top, bottom, over, above, under, and below may be used in this disclosure. These terms should not be construed as limiting the position or orientation of a structure or element, but should be used to provide spatial relationship between structures or elements.

Figure 1A:
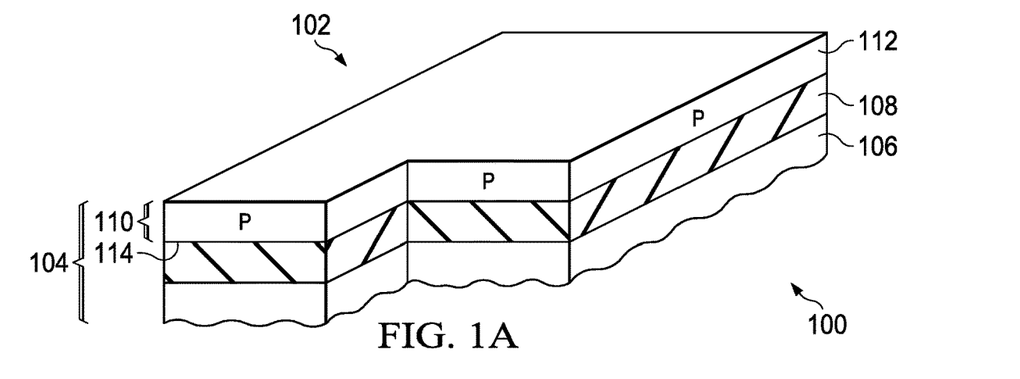
FIG. 1A through FIG. 1I are cross sections of an example semiconductor device including a JFET on an SOI substrate, depicted in stages of an example method of formation.

FIG. 1A through FIG. 1I are cross sections of an example semiconductor device 100 including a JFET 102 on an SOI substrate 104, depicted in stages of an example method of formation. Referring to FIG. 1A, the semiconductor device 100 is formed on the SOI substrate 104. In this example, the SOI substrate 104 may include a handle wafer 106, a dielectric layer 108 on the handle wafer 106, and a semiconductor layer 110 on the dielectric layer 108. The handle wafer 106 may be electrically conductive, and may include monocrystalline silicon, or other material suitable for semiconductor fabrication processing, and may be 400 microns to 800 microns thick, by way of example, to support the dielectric layer 108 and the semiconductor layer 110. The dielectric layer 108 may include silicon dioxide, aluminum oxide (sapphire), or other dielectric material, and may be 1 micron to 10 microns thick, for example, to electrically isolate the semiconductor layer 110. In an alternate version of this example, the handle wafer 106 may be omitted, and the dielectric layer 108 may be 400 microns to 800 microns thick, providing the support functionality of the handle wafer 106.

The semiconductor layer 110 may be monocrystalline, and may include silicon, silicon with germanium, silicon with carbon, or silicon carbide. Other semiconductor materials for the semiconductor layer 110 are within the scope of this example. In this example, the semiconductor layer 110 includes a first semiconductor sublayer 112 directly on the dielectric layer 108. Additional semiconductor material of the semiconductor layer 110 will be formed in subsequent fabrication operations. The semiconductor layer 110 has a bottom surface 114 at a boundary between the semiconductor layer 110 and the dielectric layer 108. The first semiconductor sublayer 112 may be 0.2 microns to 2 microns thick, by way of example. The first semiconductor sublayer 112 has a first conductivity type, which is p-type in this example. The first semiconductor sublayer 112 may have an average concentration of first conductivity type dopants of $1 \times 10^{14}$ $cm^{-3}$ to $1 \times 10^{17}$ $cm^{-3}$, by way of example.

Figure 1B:
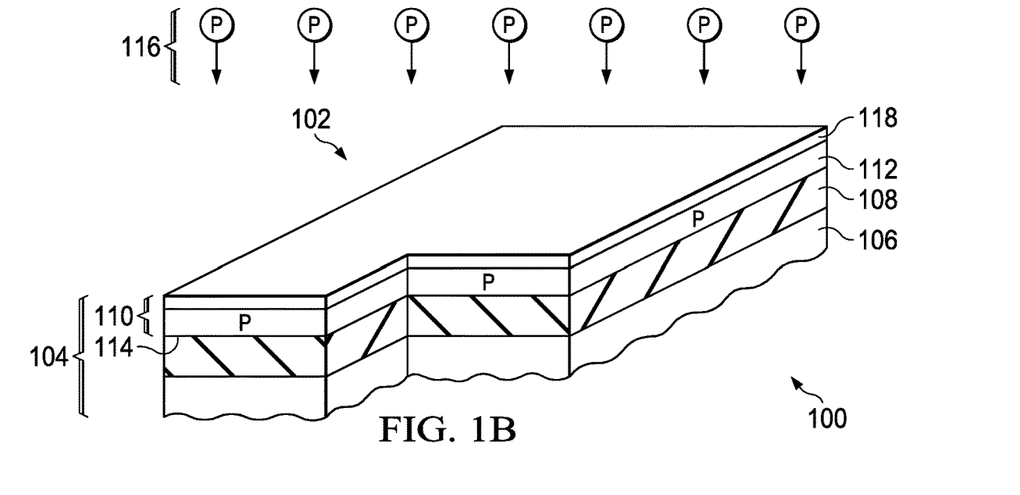

Referring to FIG. 1B, a protective layer of silicon dioxide, not shown, may be formed over the first semiconductor sublayer 112. An optional first dose of first conductivity type dopants 116 may be introduced into the first semiconductor sublayer 112, to form a first implanted region 118 in the first semiconductor sublayer 112. The first dose of the first conductivity type dopants 116 may include boron, to facilitate subsequent diffusion in the first semiconductor sublayer 112. The first dose of the first conductivity type dopants 116 may be introduced at a total dose of $1 \times 10^{11}$ $cm^{-2}$ to $1 \times 10^{13}$ $cm^{-2}$, by way of example. The first dose of the first conductivity type dopants 116 may be introduced by a beamline ion implant process, by a doped oxide process, by a plasma ion implant process, or by another process. In this example, the first dose of the first conductivity type dopants 116 may be introduced across the SOI substrate 104, as indicated in FIG. 1B. Alternatively, the first dose of the first conductivity type dopants 116 may be introduced into the SOI substrate 104 in specific areas, using an implant mask, for example.

Figure 1C:
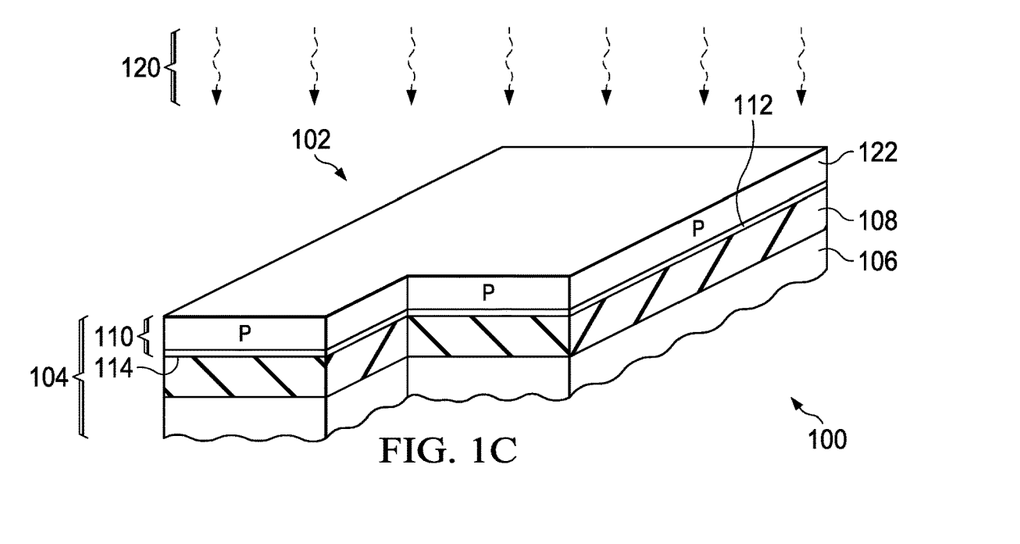

Referring to FIG. 1C, the first semiconductor sublayer 112 is heated by a heating process 120 to diffuse and activate the first conductivity type dopants in the first implanted region 118 of FIG. 1B to form an optional screen layer 122 in the first semiconductor sublayer 112. The heating process 120 may be implemented as a radiative heating process, such as a rapid thermal process, or may be implemented as a furnace heating process. The screen layer 122, if formed, has the first conductivity type, p-type in this example, and may have an average net concentration of first conductivity type dopants of $1 \times 10^{15}$ $cm^{-3}$ to $1 \times 10^{17}$ $cm^{-3}$, by way of example, to prevent inversion by a potential difference between the semiconductor layer 110 and the handle wafer 106 during operation of the JFET 102. The screen layer 122 may extend partway to the dielectric layer 108, with a portion of the first semiconductor sublayer 112 remaining between the screen layer 122 and the dielectric layer 108, as indicated in FIG. 1C. Alternatively, the screen layer 122 may extend to the dielectric layer 108. In an alternate version of this example, the heating process 120 may be omitted, and the first semiconductor sublayer 112 may be heated after implanting second conductivity type dopants for a subsequently-formed drain-side buried layer 126 and a subsequently-formed optional source-side buried layer 128, shown in FIG. 1E.

Figure 1D:
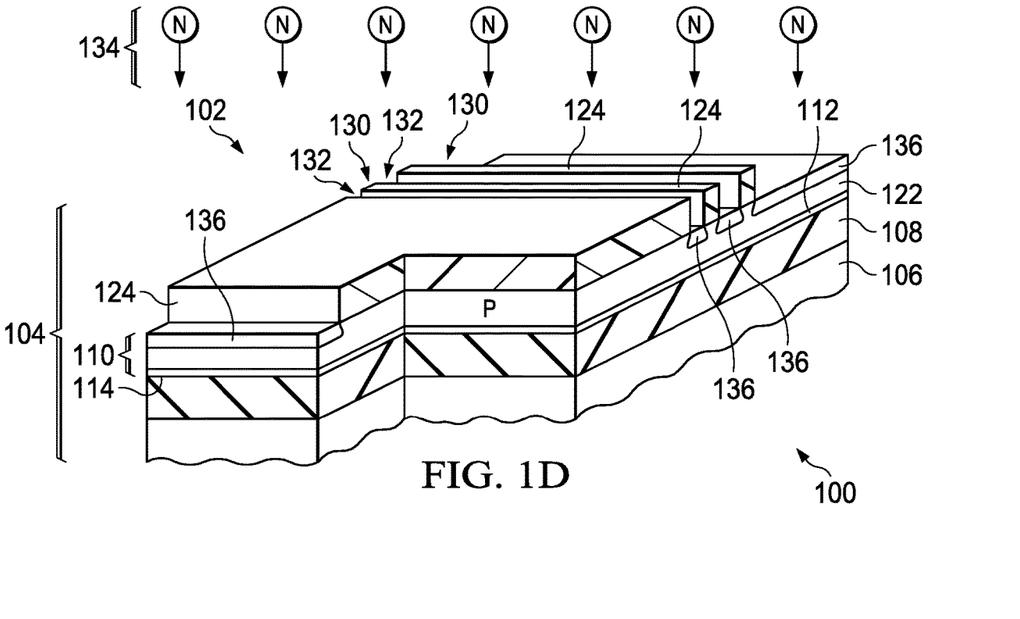

Referring to FIG. 1D, a buried layer mask 124 is formed over the first semiconductor sublayer 112. The buried layer mask 124 exposes the first semiconductor sublayer 112 in areas for the subsequently-formed drain-side buried layer 126 and the subsequently-formed optional source-side buried layer 128, shown in FIG. 1E, of the JFET 102. Referring back to FIG. 1D, the buried layer mask 124 may include photoresist, and may be formed by a photolithographic process. Alternatively, the buried layer mask 124 may include hard mask material, such as silicon dioxide. In this example, the buried layer mask 124 may have a segmented configuration, with narrow stripes 130 separated by narrow spaces 132, along an edge of the area for the subsequently-formed drain-side buried layer 126 facing a subsequently-formed channel 150, shown in FIG. 1G, to dilute a dopant concentration at the edge of the subsequently-formed drain-side buried layer 126, providing a dopant concentration gradient. Referring back to FIG. 1D, in one version of this example, the narrow stripes 130 and narrow spaces 132 may have widths that are 0.5 microns to 2 microns wide, for example. In another version, the narrow stripes 130 and narrow spaces 132 may have widths that are 25 percent the thickness of the first semiconductor sublayer 112 to 150 percent the thickness of the first semiconductor sublayer 112. In an alternate version of this example, in which the optional source-side buried layer 128 is not formed, the buried layer mask 124 may cover a source region of the first semiconductor sublayer 112.

A first dose of second conductivity type dopants 134 is introduced into the first semiconductor sublayer 112 where exposed by the buried layer mask 124, to form second implanted regions 136 in the first semiconductor sublayer 112. The first dose of the second conductivity type dopants may include arsenic, antimony, phosphorus, or a combination thereof, and may be implanted at a total dose of $1 \times 10^{11}$ $cm^{-2}$ to $1 \times 10^{14}$ $cm^2$, by way of example. The total dose of the first dose of the second conductivity type dopants 134 is greater than the total dose of the first conductivity type dopants 116, of FIG. 1B, used to form the screen layer 122, for example, 1.5 times to 10 times greater. Phosphorus in the first dose of the second conductivity type dopants may be implanted at one or more implant energies, from 50 keV to 1500 keV.

The buried layer mask 124 is removed after the first dose of the second conductivity type dopants 134 is introduced. Photoresist in the buried layer mask 124 may be removed by a plasma process with oxygen radicals, exposure to ozone, or a wet etch process using an aqueous mixture of sulfuric acid and hydrogen peroxide. Silicon dioxide in the buried layer mask 124 may be removed by a dilute (0.1 percent to 5 percent) buffered aqueous solution of hydrofluoric acid.

The first semiconductor sublayer 112 may be heated to diffuse the first dose of the second conductivity type dopants 134 in the second implanted regions 136 further into the first semiconductor sublayer 112. In versions of this example in which the buried layer mask 124 includes hard mask material, the first semiconductor sublayer 112 may optionally be heated before the buried layer mask 124 is removed.

Figure 1E:
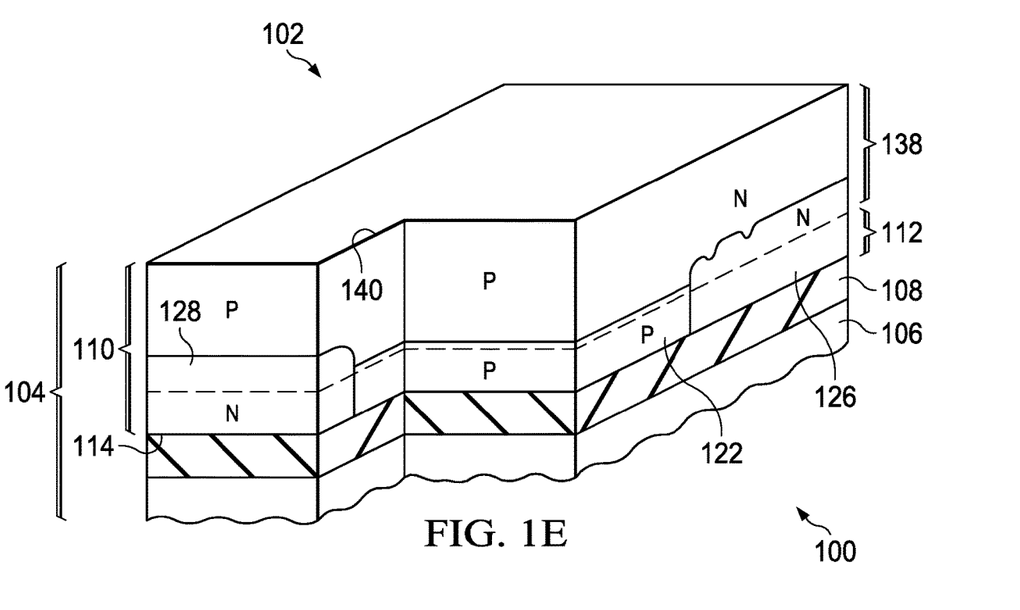

Referring to FIG. 1E, a second semiconductor sublayer 138 of the semiconductor layer 110 is formed on the first semiconductor sublayer 112. The second semiconductor sublayer 138 may be formed by an epitaxial process that includes thermal decomposition of silane, for example. The second semiconductor sublayer 138 may have a composition similar to the first semiconductor sublayer 112. The second semiconductor sublayer 138 may be 2 microns to 8 microns thick. The semiconductor layer 110 may have a total thickness of 3 microns to 10 microns. The first semiconductor sublayer 112 and the second semiconductor sublayer 138 are heated during the process of forming the second semiconductor sublayer 138, which may result in the first dose of second conductivity type dopants 134, of FIG. 1D, in the second implanted regions 136 of FIG. 1D, diffusing into the first semiconductor sublayer 112 and the second semiconductor sublayer 138 to form the drain-side buried layer 126 and the optional source-side buried layer 128 of the JFET 102. The drain-side buried layer 126 and the source-side buried layer 128 have the second conductivity type, n-type in this example. The drain-side buried layer 126 may have a dopant concentration gradient in a direction toward the subsequently-formed channel 150, shown in FIG. 1G, in which a concentration of second conductivity type dopants decreases over a lateral distance of at least twice a thickness of the drain-side buried layer 126, as a result of the buried layer mask 124 of FIG. 1D having a segmented configuration, as disclosed in reference to FIG. 1D. The first conductivity dopants in the screen layer 122 may diffuse into the first semiconductor sublayer 112 and to the dielectric layer 108, as indicated in FIG. 1E. The second semiconductor sublayer 138 extends to a top surface 140 of the semiconductor layer 110. The top surface 140 is located opposite from the bottom surface 114 of the semiconductor layer 110.

Figure 1F:
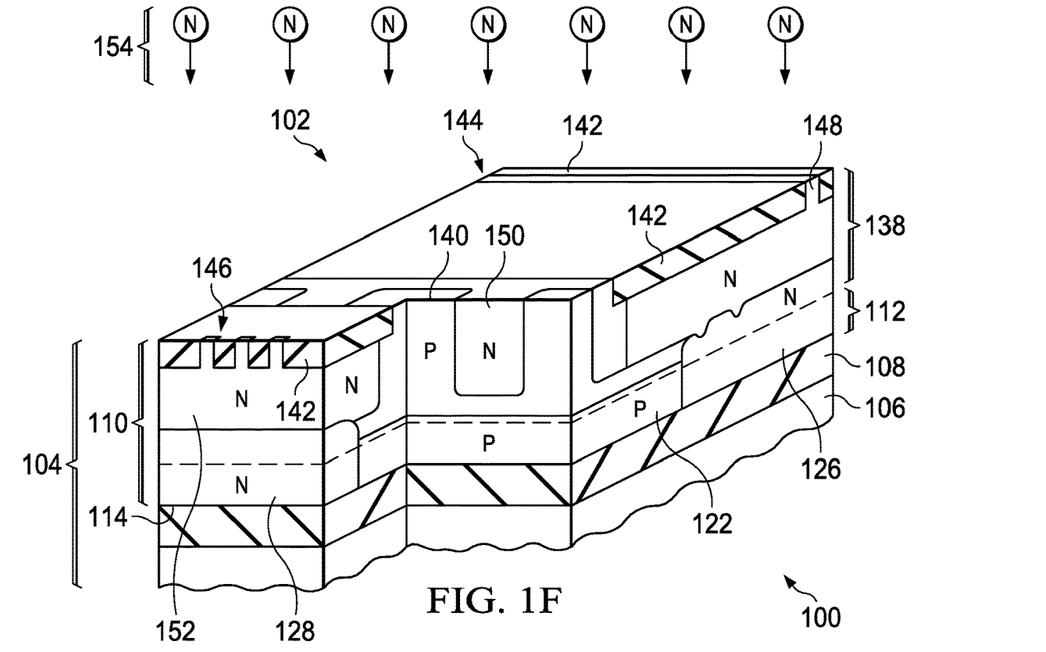

Referring to FIG. 1F, field oxide 142 is formed on the JFET 102. The field oxide 142 may have a thickness of 250 nanometers to 1 micron, by way of example. The field oxide 142 may be formed by a shallow trench isolation (STI) process, in which shallow isolation trenches are formed in the semiconductor layer 110 at the top surface 140, and the isolation trenches are filled with dielectric material such as silicon dioxide. Excess dielectric material is removed from over the top surface 140, leaving the dielectric material in the isolation trenches to provide the field oxide 142. Field oxide 142 formed by the STI process has an STI configuration, in which the isolation trenches have straight sidewalls, and the dielectric material does not extend more than 100 nanometers above the top surface 140. FIG. 1F depicts the field oxide 142 having the STI configuration. Alternatively, the field oxide 142 may be formed by a local oxidation of silicon (LOCOS) process, in which a silicon nitride layer is patterned to expose the top surface 140 in areas for the field oxide 142. The field oxide 142 is formed by thermal oxidation where exposed by the silicon nitride layer, and the silicon nitride layer is subsequently removed. Field oxide 142 formed by the LOCOS process has a LOCOS configuration, with a tapered edge, commonly referred to as a "bird's beak". Field oxide 142 formed by the LOCOS process extends above the top surface 140 by about 55 percent of the thickness of the field oxide 142. Other methods for forming the field oxide 142 are within the scope of this example. The field oxide 142 is formed to have a drain active area 144 which exposes the semiconductor layer 110 over a subsequently-formed drain well 156 shown in FIG. 1G, and to have source active areas 146 which expose the semiconductor layer 110 over a subsequently-formed source well 158 shown in FIG. 1G. In variants of this example, the drain active area 144 may be segmented, similar to the source active areas 146 as depicted in FIG. 1F, or the source active areas 146 may be continuous, similar to the drain active area 144 as depicted in FIG. 1F.

Referring back to FIG. 1F, a drift region 148, a channel 150, and a source 152 are formed in the semiconductor layer 110, above the screen layer 122, the drain-side buried layer 126, and the source-side buried layer 128. The drift region 148, the channel 150, and the source 152 have the second conductivity type. The drift region 148 contacts the drain-side buried layer 126, and extends laterally past the drain-side buried layer 126. The channel 150 contacts the drift region 148. The channel 150 may optionally have open regions, as depicted in FIG. 1F, where a subsequently-formed gate 162, shown in FIG. 1H, will be located. Referring back to FIG. 1F, the source 152 contacts the channel 150, and contacts the source-side buried layer 128.

The drift region 148 may have an average net concentration of second conductivity type dopants of $1 \times 10^{15}$ cm$^{-3}$ to $5 \times 10^{17}$ cm$^{-3}$, by way of example, to attain a desired value for a product of resistance and area, sometimes referred to as $R_{sp}$, of the JFET 102, or to attain a desired value for a saturated current of the JFET 102. The channel 150 may have an average net concentration of second conductivity type dopants of $1 \times 10^{15}$ cm$^{-3}$ to $5 \times 10^{17}$ cm$^{-3}$, by way of example, to attain a desired value for on-state resistance or the saturated current of the JFET 102. In one version of this example, the drift region 148 and the channel 150 may have equal average net concentrations of second conductivity type dopants, as a result of being formed concurrently, which may advantageously reduce fabrication cost and complexity of the semiconductor device 100. In another version, the average net concentrations of second conductivity type dopants may be different, to independently attain desired values of the $R_{sp}$ and the on-state resistance, or the saturated current.

The source 152 may have an average net concentration of second conductivity type dopants of $5 \times 10^{15}$ cm$^{-3}$ to $1 \times 10^{18}$ cm$^3$, by way of example. In one version of this example, the source 152 may have an average net concentration of second conductivity type dopants of $1 \times 10^{17}$ cm$^{-3}$ to $1 \times 10^{18}$ cm$^{-3}$, to provide a low resistance connection between the channel 150 and the source well 158. In another version, the source 152 and the channel 150 may have equal average net concentrations of second conductivity type dopants, as a result of being formed concurrently, which may advantageously reduce fabrication cost and complexity of the semiconductor device 100.

The drift region 148, the channel 150, and the source 152 may be formed by implanting a second dose of second conductivity type dopants 154 into the semiconductor layer 110, followed by heating the semiconductor layer 110 to activate the second dose of second conductivity type dopants 154. The second dose of second conductivity type dopants 154 may be implanted at a total dose of $1\times10^{12}$ cm$^{-2}$ to $4\times10^{13}$ cm$^{-2}$, by way of example. In one version of this example, the second dose of second conductivity type dopants 154 may be implanted uniformly across the JFET 102, to form the drift region 148, the channel 150, and the source 152 with equal average net concentrations of second conductivity type dopants. In another version, an implant mask used to expose the semiconductor layer 110 in areas for the drift region 148, the channel 150, and the source 152 may have a segmented configuration, as described in reference to the buried layer mask 124 of FIG. 1D, to form the channel 150 with a higher average net concentration of second conductivity type dopants than the drift region 148, or form the source 152 with a higher average net concentration of second conductivity type dopants than the channel 150. In a further version, the drift region 148, the channel 150, and the source 152 may be implanted separately. In an alternate version of this example, the field oxide 142 may be formed after forming the drift region 148, the channel 150, and the source 152.

In one version of this example, the drain-side buried layer 126 may have an average net concentration of second conductivity type dopants higher than the drift region 148. In another version of this example, the drain-side buried layer 126 may have an average net concentration of second conductivity type dopants lower than the drift region 148.

Figure 1G:
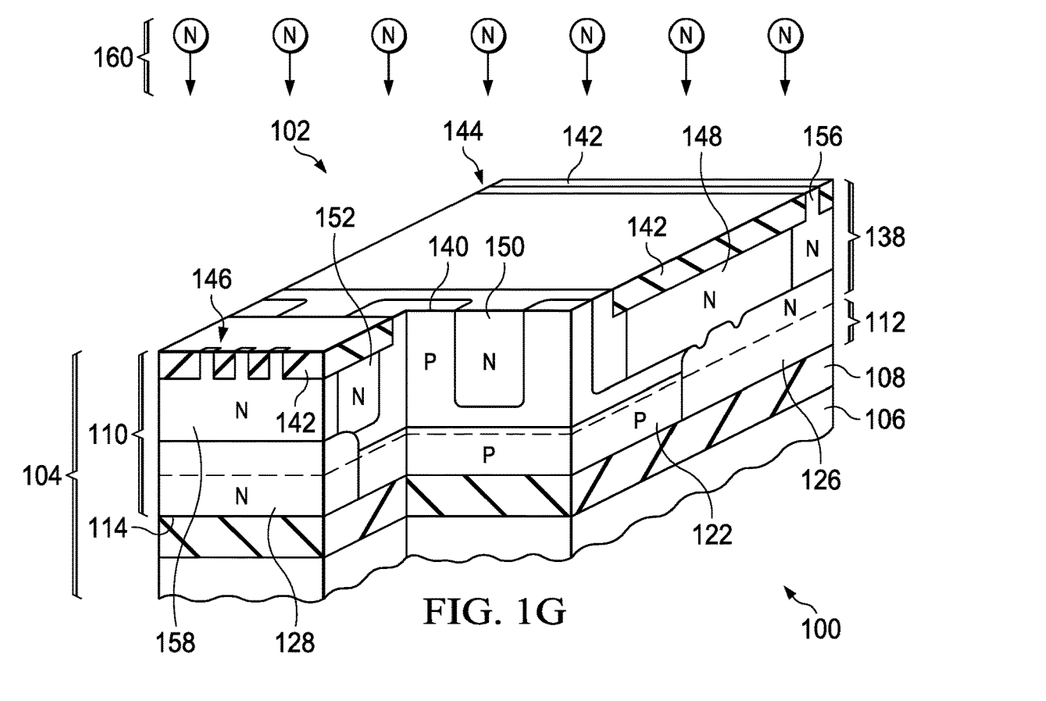

Referring to FIG. 1G, a drain well 156 and a source well 158 are formed in the semiconductor layer 110. The drain well 156 and the source well 158 have the second conductivity type, n-type in this example. The drain well 156 extends from the top surface 140 of the semiconductor layer 110 to the drain-side buried layer 126 of the JFET 102. The source well 158 extends from the top surface 140 of the semiconductor layer 110 to the source-side buried layer 128 of the JFET 102. The drain well 156 and the source well 158 may be formed by implanting a third dose of second conductivity type dopants 160 into the semiconductor layer 110, followed by heating the semiconductor layer 110 to activate the implanted third dose of second conductivity type dopants 160. The third dose of second conductivity type dopants 160 may include primarily phosphorus, to facilitate diffusion in the semiconductor layer 110 to provide a more uniform dopant distribution than would be obtained with arsenic or antimony. The third dose of second conductivity type dopants 160 may be implanted at a total dose of $1\times10^{12}$ cm$^{-2}$, to $3\times10^{14}$ cm$^2$, to attain an average net concentration of second conductivity type dopants greater than $1\times10^{17}$ cm$^{-3}$, which may advantageously provide low resistance connections to the drain-side buried layer 126 and the source-side buried layer 128. The third dose of second conductivity type dopants 160 may be implanted at two or more implant energies to distribute the third dose of second conductivity type dopants 160 more uniformly in the semiconductor layer 110, compared to implanting at a single implant energy.

Figure 1H:
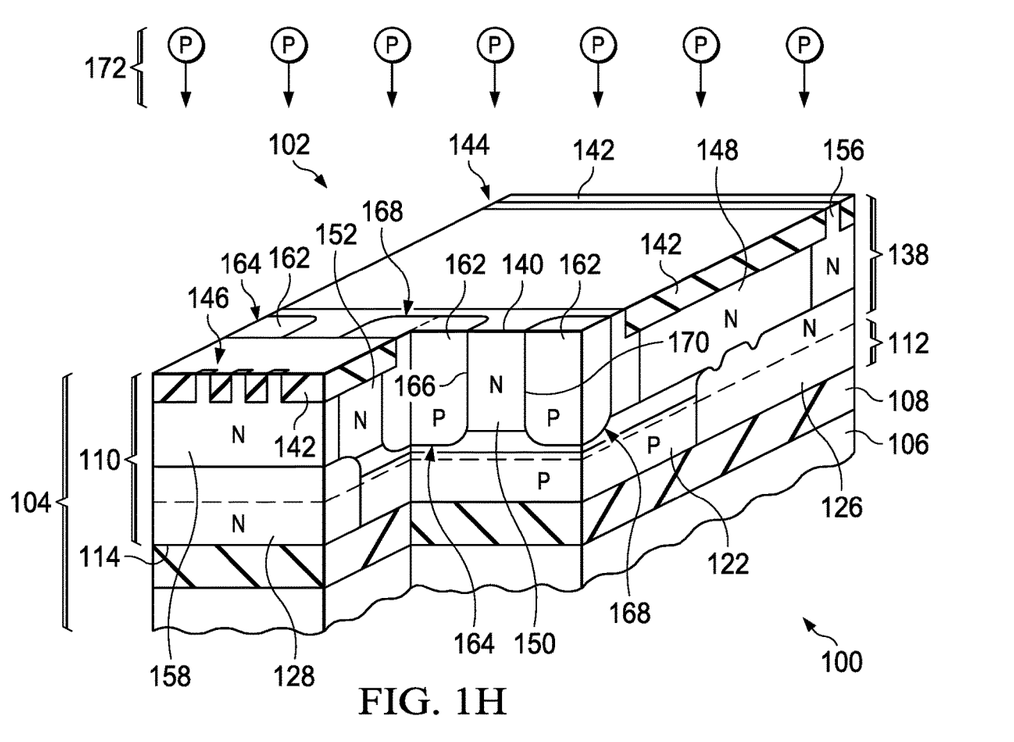

Referring to FIG. 1H, a gate 162 is formed in the semiconductor layer 110. The gate 162 has the first conductivity type. The gate 162 has first gate segments 164 that contact the channel 150 on first lateral sides 166 of the channel 150. The gate 162 further has second gate segments 168 that contact the channel 150 on second lateral sides 170 of the channel 150. The second lateral sides 170 are located opposite from the first lateral sides 166. The first gate segments 164 and the second gate segments 168 extend deeper in the semiconductor layer 110 from the top surface 140 than the channel 150. Adjacent instances of the first gate segments 164 and the second gate segments 168 may be contiguous, as depicted in FIG. 1H.

The gate 162 has an average net concentration of first conductivity type dopants that is higher than the average net concentration of second conductivity type dopants of the channel 150, for example, at least 5 times higher, to provide effective control of conductivity in the channel 150. The gate 162 may have an average net concentration of first conductivity type dopants of $1\times10^{17}$ cm$^{-3}$ to $1\times10^{18}$ cm$^{-3}$, by way of example. The average net concentration of first conductivity type dopants of the gate 162 is higher than the average net concentration of first conductivity type dopants of the screen layer 122 under the channel 150, which may advantageously provide more linearity of on-state current through the JFET 102 as a function of bias on the gate 162 compared to a comparable device with a higher first conductivity type dopant concentration in the semiconductor layer 110 under than channel 150.

The gate 162 may be formed by implanting a second dose of first conductivity type dopants 172 into the semiconductor layer 110 using a gate well mask, not shown, followed by heating the semiconductor layer 110 to activate the second dose of first conductivity type dopants 172. The second dose of first conductivity type dopants 172 may include primarily boron to provide a more uniform dopant distribution in the gate 162. The second dose of first conductivity type dopants 172 may be implanted at several energies to distribute the second dose of first conductivity type dopants 172 more uniformly as a function of depth from the top surface 140 in the semiconductor layer 110, at a total dose of $3\times10^{13}$ cm$^{-2}$ to $4\times10^{14}$ cm$^{-2}$, by way of example.

Figure 1I:
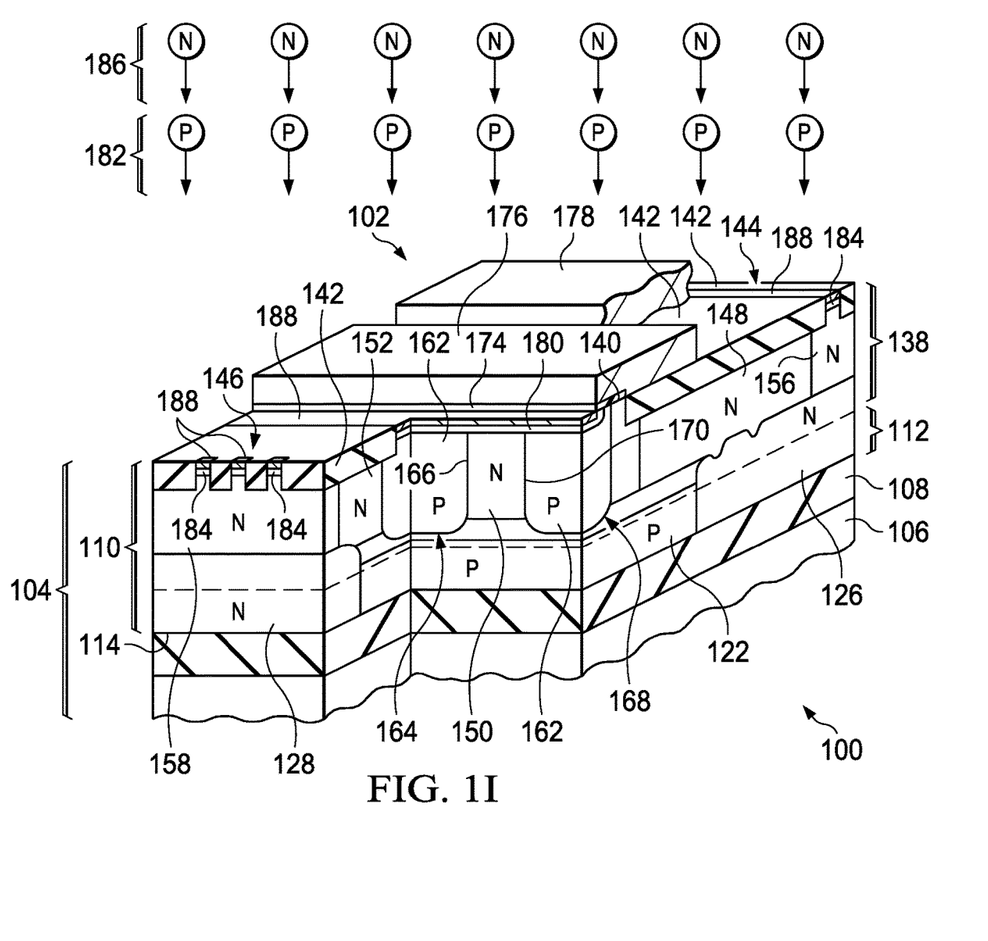

Referring to FIG. 1I, a gate dielectric layer 174 is formed on the semiconductor layer 110, extending partway over the gate 162 and the channel 150. The gate dielectric layer 174 may be a part of metal oxide semiconductor (MOS) transistors, not shown, in the semiconductor device 100. The gate dielectric layer 174 may be formed by a thermal oxidation process, by way of example.

A gate-side field plate 176 and a drain-side field plate 178 may be formed over the field oxide 142 and the gate dielectric layer 174. The gate-side field plate 176 and the drain-side field plate 178 are electrically conductive. The gate-side field plate 176 extends from the gate 162 and channel 150 partway over the drift region 148. The gate-side field plate 176 is separated from the semiconductor layer 110 by the field oxide 142 and the gate dielectric layer 174. The drain-side field plate 178 extends from the drain active areas 144 partway over the drift region 148. The drain-side field plate 178 is separated from the semiconductor layer 110 by the field oxide 142. The gate-side field plate 176 and the drain-side field plate 178 may include polycrystalline silicon, commonly referred to as polysilicon, for example. Other electrically conductive materials for the gate-side field plate 176 and the drain-side field plate 178, such as aluminum or titanium nitride, are within the scope of this example. The gate-side field plate 176 and the drain-side field plate 178 may be formed concurrently with gates of the MOS transistors. The gate-side field plate 176 and the drain-side field plate 178 may each be formed to have contiguous configurations, or may be formed to have segmented configurations. Segmented configurations may provide more effective reduction of electric fields in the drift region 148 during operation of the JFET 102.

A gate contact region 180 is formed in the semiconductor layer 110 where exposed by the field oxide 142 and the gate-side field plate 176, contacting the gate 162 and extending over the channel 150, that is, between the channel 150 and the top surface 140 of the semiconductor layer 110. The gate contact region 180 has the first conductivity type, and has an average net concentration of first conductivity type dopants higher than the gate 162, to provide a low resistance connection to the gate 162. The gate contact region 180 may be formed by implanting a third dose of first conductivity type dopants 182 into the semiconductor layer 110, followed by heating the semiconductor layer 110 to activate the third dose of first conductivity type dopants 182. The third dose of first conductivity type dopants 182 may include boron, indium, and gallium.

Source/drain contact regions 184 are formed in the semiconductor layer 110, in the drain active areas 144 and in the source active areas 146, contacting the drain well 156 and the source well 158, respectively. The source/drain contact regions 184 have the second conductivity type, and have an average net concentration of second conductivity type dopants higher than the drain well 156 and the source well 158, to provide low resistance connections to the drain well 156 and the source well 158. The source/drain contact regions 184 may be formed by implanting a fourth dose of second conductivity type dopants 186 into the semiconductor layer 110, followed by heating the semiconductor layer 110 to activate the fourth dose of second conductivity type dopants 186. The fourth dose of second conductivity type dopants 186 may include phosphorus, arsenic, and, antimony. The semiconductor layer 110 may be heated to concurrently activate the third dose of first conductivity type dopants 182 and activate the third dose and the fourth dose of second conductivity type dopants 186.

Metal silicide 188 may be formed on the gate contact region 180 and on the source/drain contact regions 184, to provide low resistance connections to the gate contact region 180 and to the source/drain contact regions 184. The metal silicide 188 may include titanium silicide, cobalt silicide, or nickel silicide, by way of example. The metal silicide 188 may be formed by forming a layer of metal on the semiconductor device 100, contacting the gate contact region 180 and on the source/drain contact regions 184. Subsequently, the semiconductor layer 110 is heated to react the layer of metal with silicon in the gate contact region 180 and on the source/drain contact regions 184, forming the metal silicide 188. In versions of this example in which the gate-side field plate 176 and the drain-side field plate 178 include polysilicon, the metal silicide 188 may be formed on gate-side field plate 176 and the drain-side field plate 178. Unreacted metal is removed from the semiconductor device 100, leaving the metal silicide 188 in place. The unreacted metal may be removed by a wet etch process using an aqueous mixture of sulfuric acid and hydrogen peroxide, or an aqueous mixture of nitric acid and hydrochloric acid, by way of example.

The JFET 102 of this example is an n-channel JFET 102. A p-channel JFET is within the scope of this example, with appropriate changes in polarities of dopants. A dopant concentration gradient in the drain-side buried layer 126, as disclosed in reference to FIG. 1E, may reduce an electric field in the drift region 148 and enable the JFET 102 to be operated with a higher potential on the drain well 156 compared to a comparable JFET without the dopant concentration gradient. The screen layer 122, by having an average net concentration of first conductivity type dopants higher than the semiconductor layer 110 between the screen layer 122 and the channel 150, may prevent high electric fields in the channel 150 and drift region 148 during operation of the JFET 102 that would cause undesired leakage current or breakdown as the handle wafer 106 is biased at high positive or negative voltages. The source-side buried layer 128 may provide for uniform current through the channel 150, by extending to the dielectric layer 108 below the source well 158. A pinch-off voltage of the JFET 102 is determined by a lateral separation of the first gate segments 164 from the corresponding second gate segments 168 across the channel 150, enabling a desired value of the pinch-off voltage to be attained by appropriate layout of the gate 162, and is advantageously insensitive to fabrication process variations encountered in forming the gate 162.

Figure 2A:
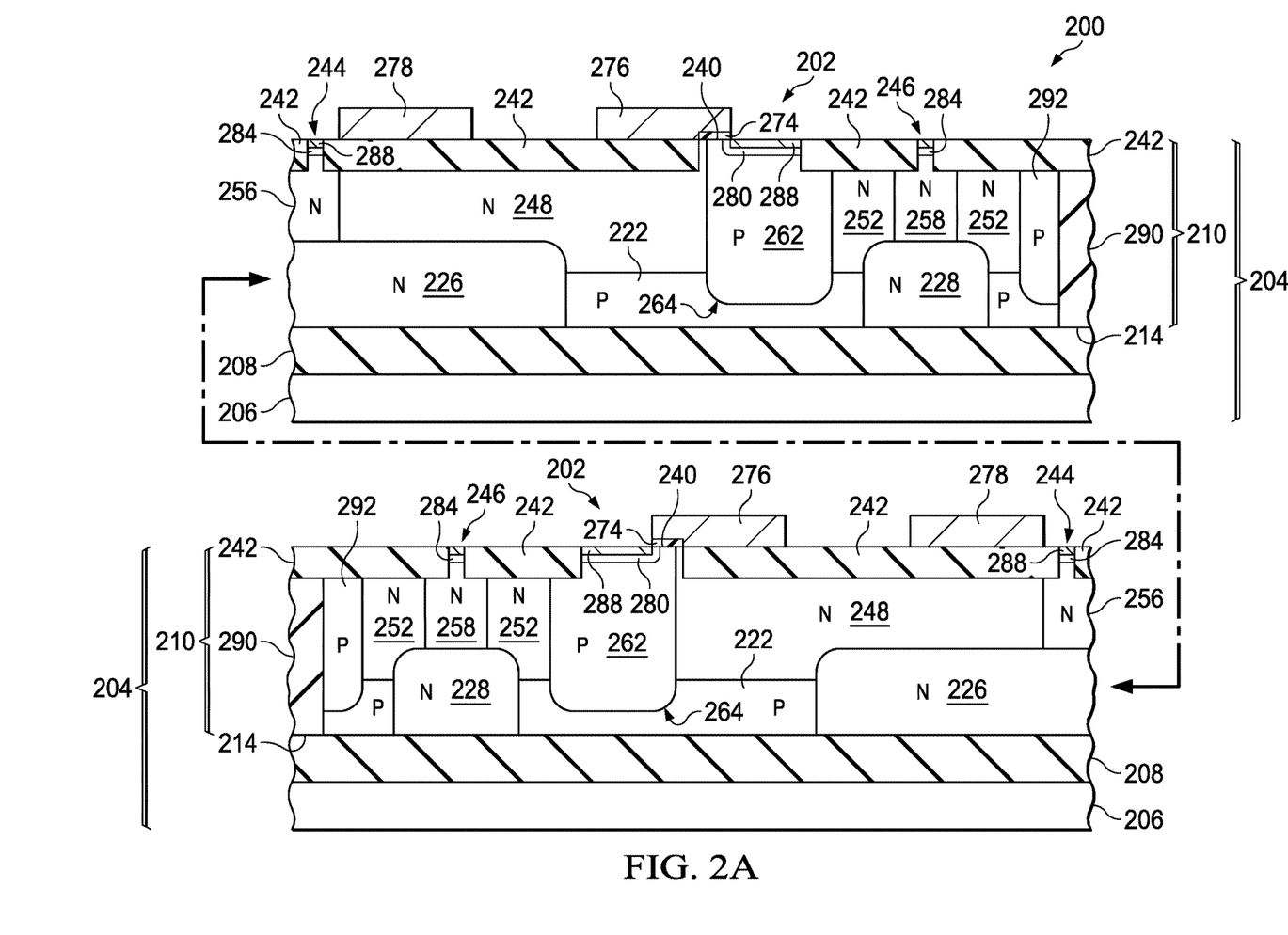
FIG. 2A and FIG. 2B are cross sections of an example semiconductor device including a JFET on an SOI substrate.
Figure 2B:
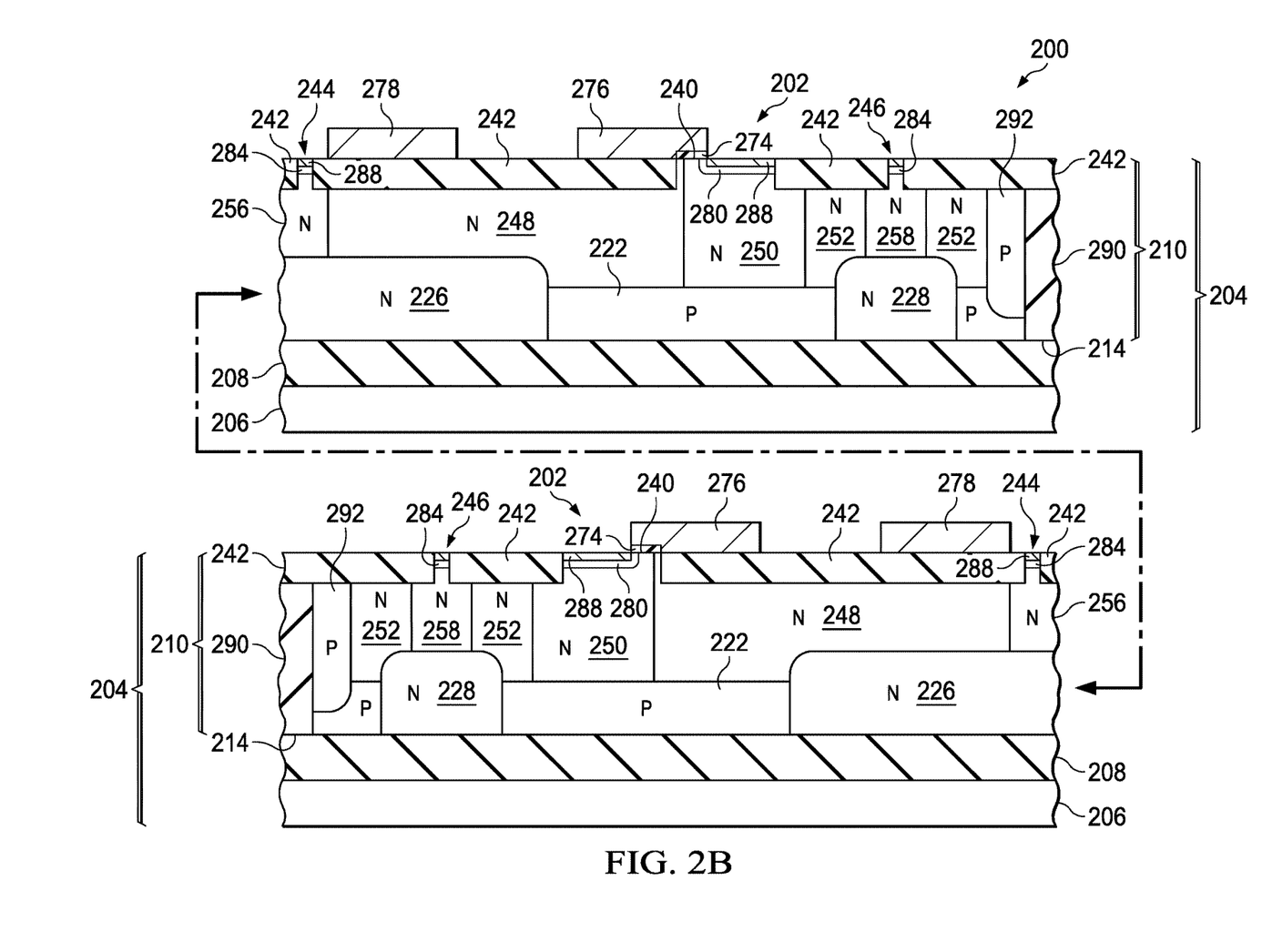

FIG. 2A and FIG. 2B are cross sections of an example semiconductor device 200 including a JFET 202 on an SOI substrate 204. Referring to FIG. 2A, the semiconductor device 200 has an SOI substrate 204, with a handle wafer 206, a dielectric layer 208 on the handle wafer 206, and a semiconductor layer 210 on the dielectric layer 208. The semiconductor layer 210 has a bottom surface 214 at a boundary between the semiconductor layer 210 and the dielectric layer 208. The semiconductor layer 210 has a top surface 240, located opposite from the bottom surface 214.

This example describes the JFET 202 as an n-channel JFET 202, with a drain-centered configuration. A p-channel version may be attained by appropriate changes in polarities of dopants. The JFET 202 includes a gate 262 in the semiconductor layer 210; the gate 262 has a first conductivity type, which is p-type in this example. FIG. 2A is a cross section through the gate 262. The gate 262 includes a first gate segment 264 and a second gate segment, which is out of the plane of FIG. 2A. The first gate segment 264 and the second gate segment are configured as disclosed in reference to FIG. 1H and FIG. 1I.

A screen layer 222 is located in the semiconductor layer 210, between the gate 262 and the bottom surface 214. The screen layer 222 has the first conductivity type, and has an average net concentration of first conductivity type dopants lower than the gate 262.

The JFET 202 includes a drain well 256 in the semiconductor layer 210. The drain well 256 has a second conductivity type, opposite from the first conductivity type. The JFET 202 includes a drift region 248 in the semiconductor layer 210 contacting the drain well 256 on two opposite sides of the drain well 256; the drift region 248 has the second conductivity type. In this example, the second conductivity type is n-type. The JFET 202 includes a channel 250, out of the plane of FIG. 2A but shown in FIG. 2B, in the semiconductor layer 210; the channel 250 has the second conductivity type. The channel 250 contacts the drift region 248 and extends between the first gate segment 264 and the second gate segment, as disclosed in reference to FIG. 1H and FIG. 1I. Referring back to FIG. 2A, the JFET 202 includes a source 252 in the semiconductor layer 210; the source 252 has the second conductivity type. The source 252 contacts the channel 250 opposite from the drift region 248. The JFET 202 includes one or more source wells 258 contacting the source 252. The source wells 258 have the second conductivity type. The drain well 256 and the source wells 258 have average net concentrations of second conductivity type dopants higher than the drift region 248 and the source 252, respectively. The drain well 256 and the source wells 258 may have equal average net concentrations of second conductivity type dopants.

The JFET 202 includes a drain-side buried layer 226 in the semiconductor layer 210, between the bottom surface 214 and the drift region 248, contacting the drain well 256, and extending laterally from the drain well 256 partway under the drift region 248 toward the channel 250. The drain-side buried layer 226 has the second conductivity type.

In one version of this example, the drain-side buried layer 226 may have an average net concentration of second conductivity type dopants higher than the drift region 248. In another version of this example, the drain-side buried layer 226 may have an average net concentration of second conductivity type dopants lower than the drift region 248. The JFET 202 may include an optional source-side buried layer 228 in the semiconductor layer 210, between the bottom surface 214 and the source 252, contacting the source wells 258. The source-side buried layer 228 has the second conductivity type, and may have an average net concentration of second conductivity type dopants equal to the drain-side buried layer 226. The screen layer 222 extends from the drain-side buried layer 226 to the source-side buried layer 228, between the bottom surface 214 and the drift region 248.

The JFET 202 includes field oxide 242 over the drift region 248 and over the source 252. The semiconductor layer 210 extends through the field oxide 242 in drain active areas 244 located over the drain well 256, and in source active areas 246 located over the source wells 258. Source/drain contact regions 284 in the drain active areas 244 and the source active areas 246 have the second conductivity type with average net concentrations of second conductivity type dopants higher than the drain well 256 and the source wells 258. Metal silicide 288 may be located on the source/drain contact regions 284.

The JFET 202 includes a gate contact region 280 having the first conductivity type in the semiconductor layer 210, located between the gate 262 and the top surface 240 of the semiconductor layer 210, and contacting the gate 262. The gate contact region 280 has an average net concentration of first conductivity type dopants higher than the gate 262. The metal silicide 288 may be located on the gate contact region 280.

The JFET 202 may include a gate-side field plate 276 over the field oxide 242, extending from the gate 262 partway over the drift region 248. A gate dielectric layer 274 may isolate the gate-side field plate 276 from the gate contact region 280. The JFET 202 may also include a drain-side field plate 278 over the field oxide 242, extending from the drain active areas 244 partway over the drift region 248.

In this example, the JFET 202 may be laterally isolated by an isolation structure 290 which extends through the semiconductor layer 210 from the bottom surface 214 to the top surface 240. The isolation structure 290 may be manifested as an electrically non-conductive structure, such as a deep trench filled with dielectric material, or as a pn junction structure, in which isolation is attained by having a pn junction reverse biased during operation of the semiconductor device 200. The JFET 202 may include termination regions 292 having the first conductivity type, located between the source 252 and the isolation structure 290. The termination regions 292 may have an average net concentration of first conductivity type dopants equal to the gate 262, for example, as a result of being formed concurrently with the gate 262. The drain-centered configuration of the JFET 202 may provide lower leakage currents and enable higher operating potentials than other configurations.

FIG. 2B is a cross section through the channel 250. The drift region 248 extends to the channel 250 from the drain well 256, and the source 252 extends to the channel 250 from the source wells 258. The screen layer 222 extends between the channel 250 and the bottom surface 214. The gate 262, shown in FIG. 2A, is out of the plane of FIG. 2B.

Figure 3:
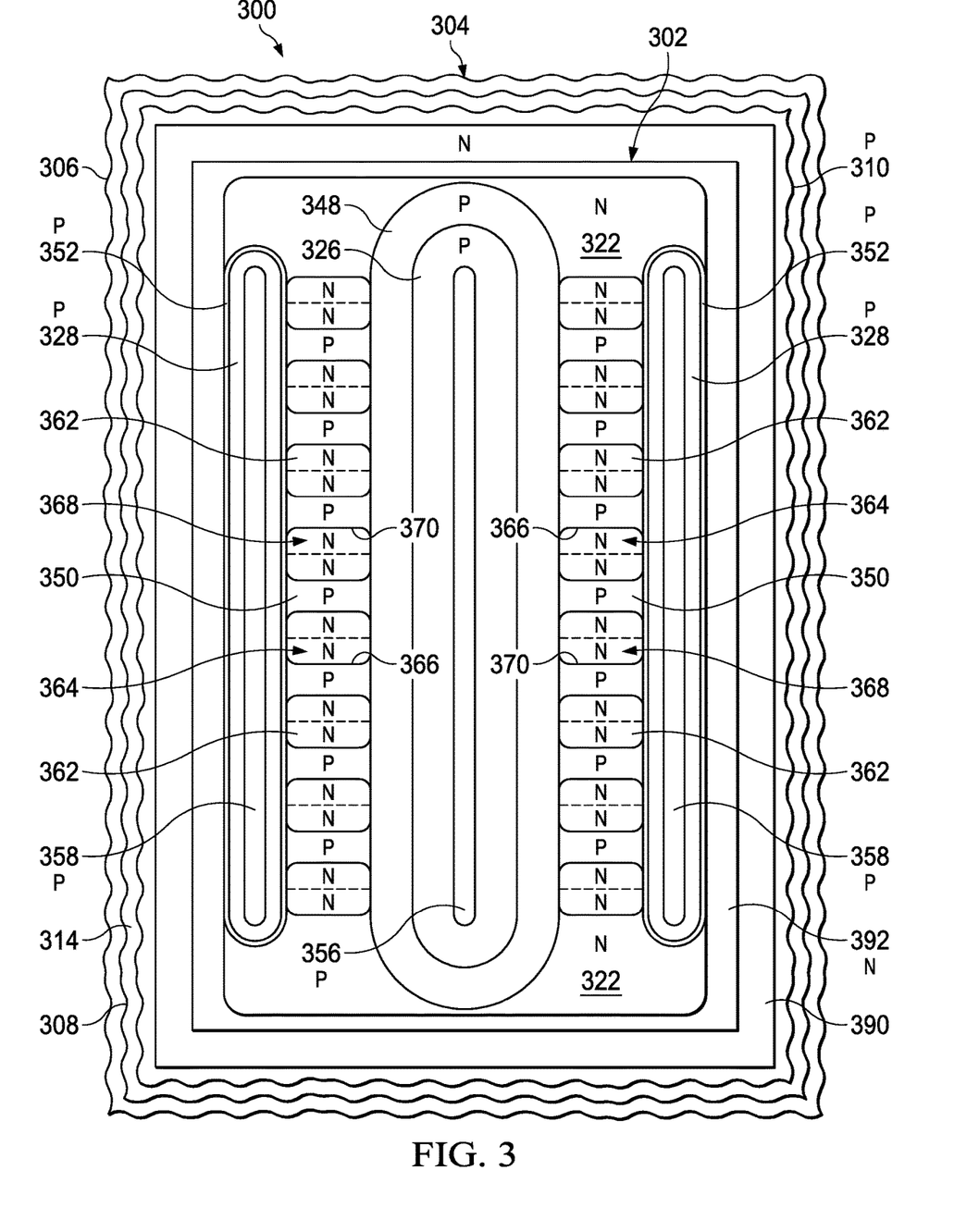
FIG. 3 is a top view of an example semiconductor device including a JFET on an SOI substrate.

FIG. 3 is a top view of an example semiconductor device 300 including a JFET 302 on an SOI substrate 304. In this example, the SOI substrate 304 may include a handle wafer 306, a dielectric layer 308 on the handle wafer 306, and a semiconductor layer 310 on the dielectric layer 308. The semiconductor device 300 is depicted in FIG. 3 with some parts removed, such as field oxide and field plates, to show spatial relationships more clearly between remaining parts of the JFET 302. The semiconductor layer 310 has a bottom surface 314 at a boundary between the semiconductor layer 310 and the dielectric layer 308. The semiconductor layer 310 has a top surface, located opposite from the bottom surface 314; the top surface is also out of the plane of FIG. 3. This example describes a p-channel JFET 302. An n-channel JFET may be attained with appropriate changes of polarities of dopants.

The JFET 302 is laterally isolated by an isolation structure 390 which surrounds the JFET 302. The isolation structure 390 may include silicon dioxide or other dielectric material. The JFET 302 may optionally include a termination region 392 that abuts the isolation structure 390. The termination region has a first conductivity type, which is n-type in this example.

The JFET 302 may optionally include a screen layer 322 in the semiconductor layer 310. The screen layer 322 has the first conductivity type, n-type in this example. The screen layer 322 extends from the bottom surface 314 partway in the semiconductor layer 310 toward the top surface.

The JFET 302 includes a drain well 356 in the semiconductor layer 310. The drain well 356 has a second conductivity type, opposite from the first conductivity type. In this example, the second conductivity type is p-type. The drain well 356 may extend continuously along a length of the JFET 302, as depicted in FIG. 3, which may advantageously reduce a resistance of the JFET 302. Alternatively, the drain well 356 may be manifested as a plurality of separate drain well segments along the center of the JFET 302, which may advantageously reduce current crowding in the JFET 302.

The JFET 302 includes a drift region 348 in the semiconductor layer 310, surrounding the drain well 356. The drift region 348 has the second conductivity type, p-type in this example. The drift region 348 has a lower average net concentration of second conductivity type dopants than the drain well 356. The JFET 302 may include a drain-side buried layer 326 in the semiconductor layer 310, between the drain well 356 and the bottom surface 314, and extending laterally partway under the drain well 356, between the drift region 348 and the bottom surface. The drain-side buried layer 326 has the second conductivity type, p-type in this example. The screen layer 322 extends laterally partway under the drain well 356, between the drift region 348 and the bottom surface 314, contacting the drain-side buried layer 326 around a perimeter of the drain-side buried layer 326.

The JFET 302 includes source wells 358 in the semiconductor layer 310, adjacent to the isolation structure 390, on opposite sides of the drift region 348. The source wells 358 have the second conductivity type, p-type in this example. The source wells 358 may extend continuously along a length of the JFET 302, as depicted in FIG. 3, or may be manifested as a plurality of separate source well segments. The JFET 302 includes a source 352 in the semiconductor layer 310. The source 352 has the second conductivity type, p-type in this example, and contacts the source wells 358. The JFET 302 may also include a source-side buried layer 328 in the semiconductor layer 310, between the source 352 and the bottom surface of the semiconductor layer 310. The source-side buried layer 328 has the second conductivity type, p-type in this example, and may have an average net concentration of second conductivity type dopants equal to the drain-side buried layer 326.

The JFET 302 further includes a gate 362 in the semiconductor layer 310, between the drift region 348 and the source 352. The gate 362 has the first conductivity type, n-type in this example. The gate 362 has an average net concentration of first conductivity type dopants higher than the screen layer 322. The gate 362 include first gate segments 364 and second gate segments 368. Each of the first gate segments 364 and the second gate segments 368 extend from the drift region 348 to the source 352.

The JFET 302 includes a channel 350 in the semiconductor layer 310. The channel 350 has the second conductivity type, p-type in this example. The channel 350 of this example is segmented, having segments of the channel 350 that extend from the drift region 348 to the source 352, between instances of the first gate segments 364 and the second gate segments 368. Each segment of the channel 350 has one of the first gate segments 364 contacting that segment on a first lateral side 366 of the segment, and has one of the second gate segments 368 contacting that segment on a second lateral side 370 of the segment located opposite from the first lateral side 366. The first gate segments 364 and the second gate segments 368 extend deeper into the semiconductor layer 310, from the top surface, than the channel 350. The first gate segments 364 and the second gate segments 368 have average net concentrations of first conductivity type dopants that are higher, for example, at least 5 times higher, than an average net concentration of second conductivity type dopants of the channel 350.

The channel 350 does not extend to the bottom surface of the semiconductor layer 310. Semiconductor material between the channel 350 and the bottom surface has the first conductivity type, with an average net concentration of first conductivity type dopants that is less than the average net concentrations of first conductivity type dopants of the first gate segments 364 and the second gate segments 368. The semiconductor material between the channel 350 and the bottom surface may include a portion of the screen layer 322.

The linear configuration of the JFET 302 may advantageously enable scaling the JFET 302 by extending lengths of the source 352, the channel 350, and the drift region 348, and correspondingly increasing instances of the first gate segments 364 and the second gate segments 368, to attain a desired on-state current through the JFET 302 during operation of the semiconductor device 300.

Figure 4:
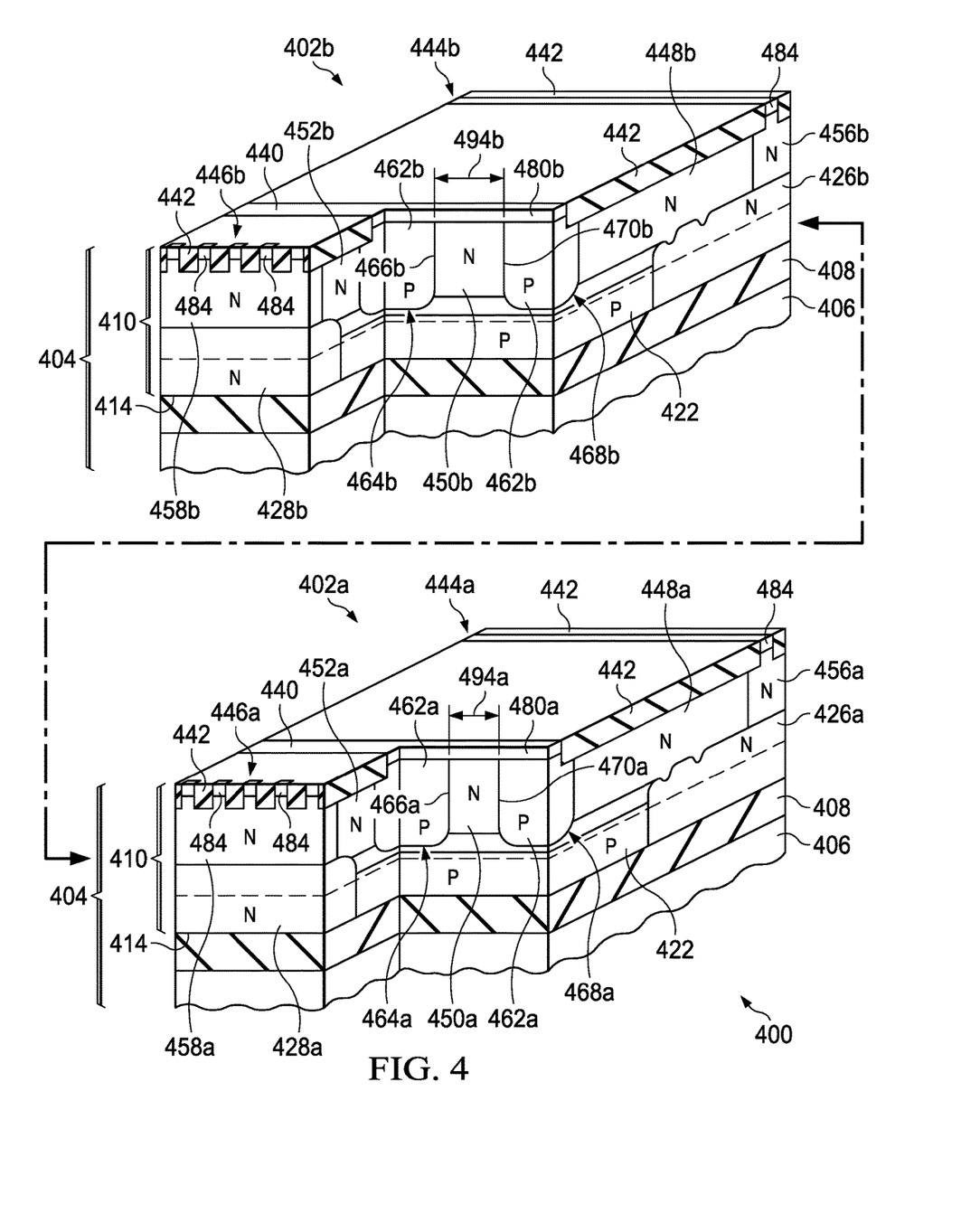
FIG. 4 is a cross section of an example semiconductor device including a first JFET and a second JFET on an SOI substrate.

FIG. 4 is a cross section of an example semiconductor device 400 including a first JFET 402a and a second JFET 402b on an SOI substrate 404. The semiconductor device 400 is formed on the SOI substrate 404. In this example, the SOI substrate 404 may include a handle wafer 406, a dielectric layer 408 on the handle wafer 406, and a semiconductor layer 410 on the dielectric layer 408. The semiconductor layer 410 has a bottom surface 414 at a boundary between the semiconductor layer 410 and the dielectric layer 408, and a top surface 440, located opposite from the bottom surface 414.

The semiconductor device 400 may include a screen layer 422 in the semiconductor layer 410 The screen layer 422 has a first conductivity type, which is p-type in this example. The screen layer 422 may extend along portions of the bottom surface 414 under the first JFET 402a and the second JFET 402b. The screen layer 422 may have an average net concentration of first conductivity type dopants as disclosed in reference to the screen layer 122 of FIG. 1C. In an alternate version of this example, the screen layer 422 may have different average net concentrations of first conductivity type dopants under the first JFET 402a and the second JFET 402b.

This example describes the first JFET 402a and the second JFET 402b as n-channel JFETs 402a and 402b. P-channel versions may be attained by appropriate changes in polarities of dopants. The first JFET 402a includes a first gate 462a in the semiconductor layer 410. The first gate 462a includes first gate segments 464a and second gate segments 468a. The second JFET 402b includes a second gate 462b in the semiconductor layer 410. The second gate 462b includes third gate segments 464b and fourth gate segments 468b. The first gate 462a and the second gate 462b have the first conductivity type, which is p-type in this example. The first gate 462a and the second gate 462b may have average net concentrations of first conductivity type dopants as disclosed in reference to the gate 162 of FIG. 1H. The first gate 462a and the second gate 462b may have average net concentrations of first conductivity type dopants that are equal, as a result of implanting first conductivity type dopants into the semiconductor layer 410 concurrently in areas for the first gate 462a and the second gate 462b, followed by heating the semiconductor layer 410 to activate the implanted first conductivity type dopants. The screen layer 422 has an average net concentration of first conductivity type dopants lower than the first gate 462a or the second gate 462b.

The first JFET 402a includes a first drift region 448a in the semiconductor layer 410, located laterally adjacent to the first gate 462a. The first drift region 448a has a second conductivity type, opposite from the first conductivity type; in this example, the second conductivity type is n-type. The first JFET 402a includes a first channel 450a in the semiconductor layer 410, laterally contacting the first drift region 448a. The first channel 450a has the second conductivity type. The first channel 450a has segments that extend between laterally opposing instances of the first gate segments 464a and the second gate segments 468a of the first gate 462a, contacting the first gate segments 464a on first lateral sides 466a of the first gate segments 464a, and contacting the second gate segment 468a on second lateral sides 470a of the second gate segments 468a. Corresponding instances of the first lateral sides 466a of the first gate segments 464a are located opposite from the second lateral sides 470a of the second gate segments 468a, across the segment of the first channel 450a that contacts the corresponding instances of the first lateral sides 466a of the first gate segments 464a. The corresponding instances of the first lateral sides 466a of the first gate segments 464a are separated by a first channel width 494a. The first channel width 494a may be selected to attain a desired first pinch-off voltage for the first JFET 402a. Increasing the first channel width 494a results in a higher absolute value of the first pinch-off voltage, while decreasing the first channel width 494a results in a lower absolute value of the first pinch-off voltage.

The first JFET 402a includes a first source 452a in the semiconductor layer 410, laterally contacting the first channel 450a opposite from the first drift region 448a. The first source 452a has the second conductivity type.

The second JFET 402b includes a second drift region 448b in the semiconductor layer 410, located laterally adjacent to the second gate 462b. The second drift region 448b has the second conductivity type. The second JFET 402b includes a second channel 450b in the semiconductor layer 410, laterally contacting the second drift region 448b. The second channel 450b has the second conductivity type. The second channel 450b has segments that extend between laterally opposing instances of the third gate segments 464b and the fourth gate segments 468b of the second gate 462b, contacting the third gate segments 464b on third lateral sides 466b of the third gate segments 464b, and contacting the fourth gate segment 468b on fourth lateral sides 470b of the fourth gate segments 468b. Corresponding instances of the third lateral sides 466b are located opposite from the fourth lateral sides 470b of the fourth gate segments 468b, across the segment of the second channel 450b that contacts the corresponding instances of the third lateral sides 466b of the third gate segments 464b. The corresponding instances of the third lateral sides 466b and the fourth lateral sides 470b are separated by a second channel width 494b. The second channel width 494b may be selected to attain a desired second pinch-off voltage for the second JFET 402b. Increasing the second channel width 494b results in a higher absolute value of the second pinch-off voltage, while decreasing the second channel width 494b results in a lower absolute value of the second pinch-off voltage.

The second channel width 494b is larger than the first channel width 494a, so that the absolute value of the second pinch-off voltage is lower than the absolute value than the first pinch-off voltage. The first gate 462a may be formed concurrently with the second gate 462b, and the first channel 450a may be formed concurrently with the second channel 450b, advantageously forming JFETs with different pinch-off voltages without requiring additional process steps or added process complexity.

The second JFET 402b includes a second source 452b in the semiconductor layer 410, laterally contacting the second channel 450b opposite from the second drift region 448b. The second source 452b has the second conductivity type. The first drift region 448a, the first channel 450a, and the first source 452a may have average net concentrations of second conductivity type dopants as disclosed in reference to the drift region 148, the channel 150, and the source 152 of FIG. 1G. The second drift region 448b, the second channel 450b, and the second source 452b may have average net concentrations of second conductivity type dopants equal to the first drift region 448a, the first channel 450a, and the first source 452a may have average net concentrations of second conductivity type dopants, respectively, as a result of being formed concurrently.

The first JFET 402a includes a first drain well 456a in the semiconductor layer 410, having the second conductivity type, contacting the first drift region 448a. The first JFET 402a further includes a first source well 458a in the semiconductor layer 410, having the second conductivity type, contacting the first source 452a. The first JFET 402a includes a first drain-side buried layer 426a in the semiconductor layer 410, having the second conductivity type, between the first drain well 456a and the bottom surface 414, extending laterally partway under the first drift region 448a. The first JFET 402a may optionally include a first source-side buried layer 428a in the semiconductor layer 410, having the second conductivity type, between the first source well 458a and the bottom surface 414.

The second JFET 402b includes a second drain well 456b in the semiconductor layer 410, having the second conductivity type, contacting the second drift region 448b. The second JFET 402b further includes a second source well 458b in the semiconductor layer 410, having the second conductivity type, contacting the second source 452b. The second JFET 402b includes a second drain-side buried layer 426b in the semiconductor layer 410, having the second conductivity type, between the second drain well 456b and the bottom surface 414, extending laterally partway under the second drift region 448b. The second JFET 402b may optionally include a second source-side buried layer 428b in the semiconductor layer 410, having the second conductivity type, between the second source well 458b and the bottom surface 414.

The first drain well 456a, the first source well 458a, the second drain well 456b, and the second source well 458b may have average net concentrations of second conductivity type dopants as disclosed in reference to the drain well 156 and the source well 158 of FIG. 1F. The first drain well 456a, the first source well 458a, the second drain well 456b, and the second source well 458b may have equal average net concentrations of second conductivity type dopants, as a result of being formed concurrently. The first drain-side buried layer 426a, the first source-side buried layer 428a, the second drain-side buried layer 426b, and the second source-side buried layer 428b may have average net concentrations of second conductivity type dopants as disclosed in reference to the drain-side buried layer 126, the source-side buried layer 128 of FIG. 1E. The first drain-side buried layer 426a, the first source-side buried layer 428a, the second drain-side buried layer 426b, and the second source-side buried layer 428b may have equal average net concentrations of second conductivity type dopants, as a result of being formed concurrently.

The semiconductor device 400 may include field oxide 442 on the semiconductor layer 410. The field oxide 442 may partially cover the first JFET 402a and the second JFET 402b, as depicted in FIG. 4. The semiconductor layer 410 may extend through the field oxide 442 in a first drain active area 444a located over the first drain well 456a, in a first source active area 446a located over the first source well 458a, in a second drain active area 444b located over the second drain well 456b, and in a second source active area 446b located over the second source well 458b. The semiconductor device 400 may include source/drain contact regions 484 having the second conductivity type in the first drain active area 444a, the first source active area 446a, the second drain active area 444b, and the second source active area 446b, contacting the first drain well 456a, the first source well 458a, the second drain well 456b, and the second source well 458b, respectively. The first JFET 402a may include a first gate contact region 480a having the first conductivity type contacting the first gate 462a, and the second JFET 402b may include a second gate contact region 480b having the first conductivity type contacting the second gate 462b, for example as disclosed in reference to FIG. 1I. Metal silicide, not shown in FIG. 4, may be formed on the first gate contact region 480a, the second gate contact region 480b, and on the source/drain contact regions 484, to provide low resistance connections to the first gate contact region 480a, the second gate contact region 480b, and the source/drain contact regions 484.

The first JFET 402a and the second JFET 402b may include field plates, not shown in FIG. 4, over the field oxide 442, for example as disclosed in reference to FIG. 1I. The semiconductor device 400 may include metal silicide, not shown in FIG. 4, on the semiconductor layer 410, for example as disclosed in reference to FIG. 1I.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device including a junction field effect transistor (JFET), the JFET comprising:
    a gate in a semiconductor layer over a substrate, the gate having a first conductivity type and including a first gate segment and a second gate segment;
    a channel in the semiconductor layer, the channel having a second conductivity type, opposite from the first conductivity type, the channel located between and touching the first gate segment and the second gate segment and intersecting a top surface of the semiconductor layer; and
    a drift region in the semiconductor layer, the drift region contacting the channel and the first and second gate segments, the drift region having the second conductivity type,
    wherein the JFET is a first JFET, the gate is a first gate, the drift region is a first drift region, and the channel is a first channel having a first channel width, and further comprising a second JFET, the second JFET including:
        a second gate in the semiconductor layer, the second gate having the first conductivity type, the second gate including a third gate segment and a fourth gate segment; and
        a second channel in the semiconductor layer between and touching the third gate segment and the fourth gate segment, the second channel having the second conductivity type and a second channel width greater than the first channel width.

2. The semiconductor device of claim 1, further comprising a drain-side buried layer in the semiconductor layer, the drain-side buried layer being located between the drift region and a bottom surface, and extending laterally along at least a portion of the drift region, the drain-side buried layer having the second conductivity type.

3. The semiconductor device of claim 2, wherein the drain-side buried layer has a dopant concentration gradient in a direction from the drain toward the channel, in which a concentration of second conductivity type dopants decreases over a lateral distance of at least twice a thickness of the drain-side buried layer.

4. The semiconductor device of claim 2, wherein the substrate is a silicon-on-insulator (SOI) substrate, and the drain-side buried layer touches a dielectric layer of the SOI substrate.

5. The semiconductor device of claim 1, further comprising a screen layer in the semiconductor layer between the channel and the substrate, the screen layer having the first conductivity type, the screen layer having an average net concentration of first conductivity type dopants lower than an average net dopant concentration of the first gate segment and the second gate segment.

6. The semiconductor device of claim 1, the JFET further including:
    a source in the semiconductor layer, the source having the second conductivity type, the source contacting the channel opposite from the drift region; and
    a source-side buried layer in the semiconductor layer between the source and the substrate, the source-side buried layer having the second conductivity type.

7. The semiconductor device of claim 1, wherein the JFET has a drain-centered configuration.

8. The semiconductor device of claim 1, wherein the first conductivity type is p-type and the second conductivity type is n-type.

9. A semiconductor device, comprising:
    a first junction field effect transistor (JFET) including:
        a first gate in a semiconductor layer over a substrate, the first gate having a first conductivity type and including a first gate segment and a second gate segment;
        a first channel in the semiconductor layer, the first channel having a second conductivity type, opposite from the first conductivity type, the first channel having a first channel width and located between and touching the first gate segment and the second gate segment; and
        a drift region in the semiconductor layer, the drift region contacting the first channel and the first and second gate segments, the drift region having the second conductivity type; and
    a second JFET including:
        a second gate in the semiconductor layer, the second gate having the first conductivity type and including a third gate segment and a fourth gate segment; and
        a second channel in the semiconductor layer, and having the second conductivity type, the second channel located between and touching the third gate segment and the fourth gate segment, the second channel having a second channel width greater than the first channel width.

10. The semiconductor device of claim 9, wherein the first conductivity type is p-type and the second conductivity type is n-type.

11. An integrated circuit, comprising:
    a junction field-effect transistor (JFET) having a plurality of gates in a semiconductor layer over a substrate, the gates extending in parallel between a source region and a drain region, the source and drain region and gates having a first conductivity type;
    a plurality of channel regions extending in parallel between the source region and the drain region, the channel regions having a second conductivity type opposite to the first conductivity type and interleaved with the plurality of gates.

12. The integrated circuit of claim 11, wherein the source region is a first source region, the plurality of gates is a first plurality of gates, and the plurality of channel regions is a first plurality of channel regions, and further comprising a second source region extending parallel to the first source region, a second plurality of gates extending in parallel between the second source region and the drain region, and a second plurality of channel regions interleaved with the second plurality of gates.

13. The integrated circuit of claim 11, wherein the first conductivity type is p-type and the second conductivity type is n-type.

14. The integrated circuit of claim 11, wherein the plurality of channel regions intersect a top surface of the substrate.

15. The integrated circuit of claim 11, wherein the substrate is a silicon-on-insulator (SOI) substrate.

* * * * *